United States Patent
Kim et al.

(10) Patent No.: US 12,387,807 B2
(45) Date of Patent: Aug. 12, 2025

(54) MEMORY DEVICE, SYSTEM AND METHOD EMPLOYING MULTIPHASE CLOCK

(71) Applicant: SAMSUNG ELECTRONICS CO., LTD., Suwon-si (KR)

(72) Inventors: Hyochang Kim, Suwon-si (KR); Changsik Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 213 days.

(21) Appl. No.: 18/061,764

(22) Filed: Dec. 5, 2022

(65) Prior Publication Data

US 2023/0368855 A1 Nov. 16, 2023

(30) Foreign Application Priority Data

May 10, 2022 (KR) .......................... 10-2022-0057058

(51) Int. Cl.
*G06F 1/04* (2006.01)
*G11C 7/06* (2006.01)
(Continued)

(52) U.S. Cl.
CPC .............. *G11C 29/023* (2013.01); *G06F 1/04* (2013.01); *G11C 7/062* (2013.01); *G11C 7/1012* (2013.01);
(Continued)

(58) Field of Classification Search
CPC ..... G11C 29/023; G11C 7/062; G11C 7/1012; G11C 7/1066; G11C 7/1093; G11C 7/22; G11C 7/222; G11C 29/022; G11C 29/028; G11C 7/1057; G11C 7/1084; G11C 2029/0411; G11C 2207/2254; G06F 1/04; H03K 5/135
See application file for complete search history.

(56) References Cited

U.S. PATENT DOCUMENTS 7,342,986 B2 3/2008 Nakamura et al.
8,004,336 B2 * 8/2011 Yoon ..................... H03L 7/0814
327/233

(Continued)

FOREIGN PATENT DOCUMENTS

KR 10-1079758 10/2011

*Primary Examiner* — Amir Zarabian
*Assistant Examiner* — Justin Bryce Heisterkamp
(74) *Attorney, Agent, or Firm* — Morgan, Lewis & Bockius LLP

(57) ABSTRACT

A memory device includes a DC conversion circuit that receives a first edge-triggered phase signal having first pulses each extending from a rising edge of a first phase signal of a multiphase clock to a later rising edge of a second phase signal of the multiphase clock and a second edge-triggered phase signal having second pulses each extending from a rising edge of the second phase signal to a later rising edge of the first phase signal, and outputting a first voltage corresponding to the first edge-triggered phase signal and a second voltage corresponding to the second edge-triggered phase signal, a comparator that compares the first voltage with the second voltage, control logic that generates a control code corresponding to an output value from the comparator, and a delay cell that delays the second phase signal according to the control code.

20 Claims, 15 Drawing Sheets

(51) Int. Cl.
  *G11C 7/10* (2006.01)
  *G11C 7/22* (2006.01)
  *G11C 29/02* (2006.01)
  *H03K 5/135* (2006.01)
  *G11C 29/04* (2006.01)

(52) U.S. Cl.
  CPC .......... *G11C 7/1066* (2013.01); *G11C 7/1093* (2013.01); *G11C 7/22* (2013.01); *G11C 7/222* (2013.01); *G11C 29/022* (2013.01); *G11C 29/028* (2013.01); *H03K 5/135* (2013.01); *G11C 7/1057* (2013.01); *G11C 7/1084* (2013.01); *G11C 2029/0411* (2013.01); *G11C 2207/2254* (2013.01)

(56) References Cited

U.S. PATENT DOCUMENTS

| | | | |
|---|---|---|---|
| 8,704,553 | B2 | 4/2014 | Pun et al. |
| 9,294,063 | B1 | 3/2016 | Partow et al. |
| 10,270,429 | B1* | 4/2019 | Wang .......................... G06F 1/10 |
| 10,686,435 | B2* | 6/2020 | Seo ........................... H03K 5/19 |
| 11,256,286 | B1* | 2/2022 | Meikanda Muthu Ayyanar ......... G06F 1/04 |
| 11,550,355 | B2* | 1/2023 | Hong ....................... H03K 5/05 |
| 2011/0156757 | A1* | 6/2011 | Hayashi ........... G01R 31/31726 327/161 |
| 2015/0303909 | A1* | 10/2015 | Arcudia ................ H03L 7/0807 327/158 |
| 2017/0005782 | A1* | 1/2017 | Im .......................... H04L 7/048 |
| 2017/0033746 | A1 | 2/2017 | Lam et al. |
| 2017/0033774 | A1* | 2/2017 | Hedayati .............. H03K 5/1565 |
| 2018/0331682 | A1* | 11/2018 | Duduman ............... H02M 1/38 |
| 2018/0343011 | A1* | 11/2018 | Tajalli .................... H03L 7/089 |
| 2019/0081619 | A1* | 3/2019 | Kim .................... H03K 5/1565 |
| 2019/0335556 | A1* | 10/2019 | Li ......................... H05B 45/10 |
| 2020/0336148 | A1* | 10/2020 | Im .......................... H03L 7/085 |
| 2021/0203473 | A1* | 7/2021 | Basil ..................... H03L 7/0807 |
| 2021/0271301 | A1 | 9/2021 | Tell |
| 2022/0197330 | A1* | 6/2022 | Xavier .................. H03L 7/0818 |
| 2022/0303160 | A1* | 9/2022 | Nuebling ................. H04B 5/75 |
| 2022/0336004 | A1* | 10/2022 | Yoon .................... H03K 5/1565 |
| 2022/0343957 | A1* | 10/2022 | Yoon ...................... G11C 29/52 |
| 2023/0029968 | A1* | 2/2023 | Chang .................. H03K 5/1565 |
| 2023/0035176 | A1* | 2/2023 | Jeong ................. G11C 11/4076 |
| 2023/0082056 | A1* | 3/2023 | Han ......................... G06F 1/10 |
| 2024/0171168 | A1* | 5/2024 | Jia ....................... G11C 11/4076 |

\* cited by examiner

MEMORY DEVICE, SYSTEM AND METHOD EMPLOYING MULTIPHASE CLOCK

CROSS-REFERENCE TO RELATED APPLICATION(S)

This application claims benefit of priority to Korean Patent Application No. 10-2022-0057058 filed on May 10, 2022 in the Korean Intellectual Property Office, the disclosure of which is incorporated herein by reference in its entirety.

TECHNICAL FIELD

This disclosure relates generally to a memory device, a memory system having the same, and an operating method thereof, employing a multiphase clock.

DISCUSSION OF RELATED ART

Herein, a multiphase clock signal refers to a plurality of clock signals, ideally with the same clock frequency but offset by a predetermined phase from one another. In general, memory devices may serialize or deserialize data signals using a multiphase clock signal to achieve high speed read/write operations. However, if the timing of one or more of the clock signals is off (resulting in skew error), corrective measures should be taken to prevent deterioration of memory system performance.

SUMMARY

An aspect of the present inventive concept is to provide a memory device providing multiphase spacing error detection and correction, a memory system having the same, and a method of operating the same.

According to an aspect of the present inventive concept, a memory device includes: a DC conversion circuit receiving a first edge-triggered phase signal having first pulses each extending from a rising edge of a first phase signal of a multiphase clock to a later rising edge of a second phase signal of the multiphase clock, and a second edge-triggered phase signal having second pulses each extending from a rising edge of the second phase signal to a later rising edge of the first phase signal and outputting a first voltage corresponding to the first edge-triggered phase signal and a second voltage corresponding to the second edge-triggered phase signal; a comparator comparing the first voltage with the second voltage; a control logic generating a control code corresponding to an output value from the comparator; and a delay circuit delaying the second phase signal according to the control code.

According to another aspect of the present inventive concept, a memory device includes: a plurality of DC conversion circuits each outputting a first voltage and a second voltage corresponding to a spacing error of two phase signals among a plurality of phase signals; a multiplexer sequentially outputting the first voltage and the second voltage from each of the plurality of DC conversion circuits in response to a selection code; a comparator comparing the first voltage and the second voltage output from the multiplexer; a control logic generating a control code corresponding to an output value from the comparator; and a demultiplexer outputting the control code to a corresponding delay circuit among a plurality of delay circuits in response to the selection code.

According to another aspect of the present inventive concept, an operating method of a memory device includes: generating first and second edge-triggered phase signals based on first and second phase signals having the same period; extracting DC voltages from each of the first and second edge-triggered phase signals using a respective low-pass filter; level-shifting each of the extracted DC voltages to approximately one half of a power supply voltage; comparing the level-shifted voltages; and controlling a delay circuit corresponding to the second phase signal according to a comparison result.

According to another aspect of the present inventive concept, a memory system includes: a memory device receiving a clock signal and a command/address signal; and a controller outputting the clock signal and the command/address signal to the memory device to transmit and receive a data signal to and from the memory device, wherein the memory device includes a multiphase space skew adjuster detecting and correcting a spacing error of a multiphase clock signal corresponding to the clock signal.

According to another aspect of the present inventive concept, an operating method of a controller includes: transmitting a 4-phase clock to a memory device; requesting quad skew training from the memory device; receiving skew information corresponding to the quad skew training from the memory device; and adjusting the 4-phase clock using the skew information, wherein the quad skew training includes detecting a spacing error of the 4-phase clock using a low-pass filter and storing the skew information corresponding to the spacing error.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Herein, the term "phase signal" refers to a clock signal among a plurality of clock signals (each having the same frequency) of a multiphase clock. A phase signal has a timing (phase) that differs from the timing of another clock signal(s) of the multiphase clock.

Herein, an "edge-triggered phase signal" refers to a pulse train signal in which each pulse may be triggered by an edge of a clock signal of a multiphase clock. Each pulse may extend from a rising edge of a first clock signal of the multiphase clock to a later (e.g., next) rising edge of a second clock signal of the multiphase clock. Thus, each pulse may have a rising edge aligned with a rising edge of the first clock signal and a falling edge aligned with a later (e.g., next) rising edge of the second clock signal.

A memory device, a memory system having the same, and an operating method thereof according to an embodiment of the present inventive concept may convert a spacing error (or skew) between clock signals of a multiphase clock into an error voltage, through comparison of edge-triggered phase signals. The error voltage may be detected through use of a DC converter that obtains DC voltages, each representing or corresponding to a DC level (e.g., proportional to the duty cycle) of one of the edge-triggered phase signals, using a low-pass filter and a level shifter including a resistor. The DC voltages corresponding to two edge-triggered phase signals may be compared by a comparator to obtain the detected error voltage, and the spacing error may be corrected based on the error voltage.

Figure 1:
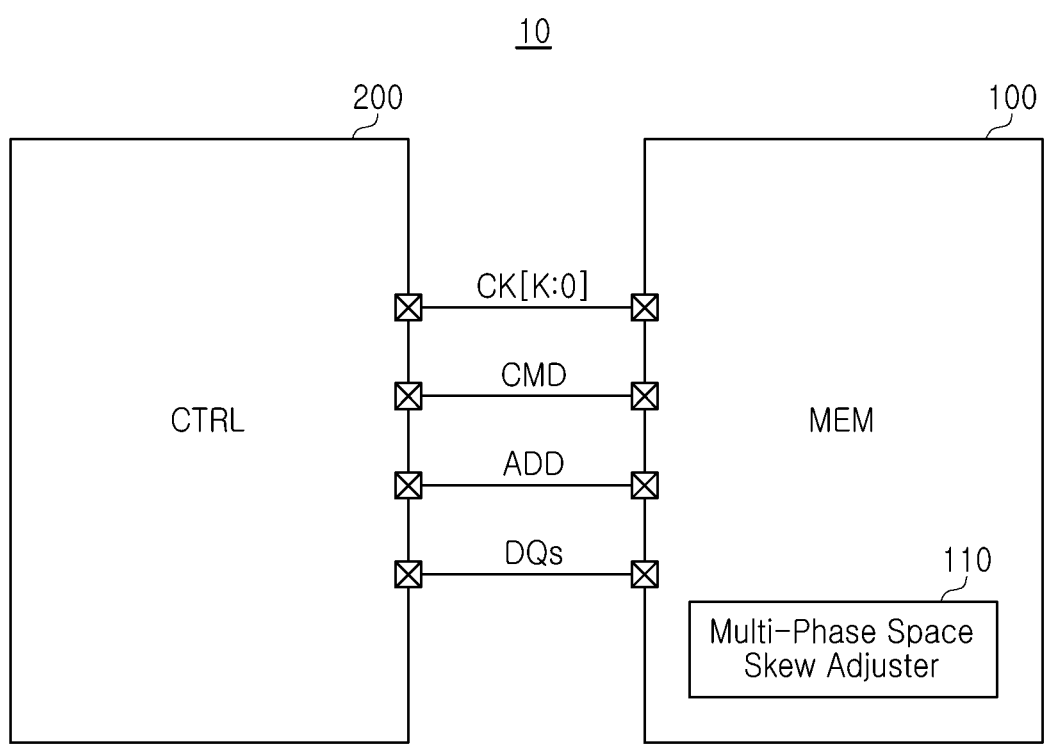
FIG. 1 is a diagram illustrating a memory system according to an embodiment of the present inventive concept.

FIG. 1 is a diagram illustrating a memory system according to an embodiment of the present inventive concept. Referring to FIG. 1, a memory system 10 may include a memory device (MEM) 100 and a memory controller (CTRL) 200.

The memory system 10 may be implemented to be included in a personal computer (PC) or a mobile electronic device. Mobile electronic devices include laptop computers, mobile phones, smartphones, tablet PCs, personal digital assistants (PDAs), enterprise digital assistants (EDAs), digital still cameras, digital video cameras, and portable multimedia players (PMPs), personal navigation devices or portable navigation devices (PNDs), handheld game consoles, mobile Internet devices (MIDs), wearable computers, Internet of things (IoT) devices, Internet of everything (IoE) devices or drones.

The memory device (MEM) 100 may be implemented as a volatile memory device. The volatile memory device may be implemented as random access memory (RAM), dynamic RAM (DRAM), static RAM (SRAM), or low power double data rate (LPDDR) DRAM. In another embodiment, the memory device 100 may be implemented as a non-volatile memory device. Non-volatile memory devices include electrically erasable programmable read-only memory (EEPROM), NOR flash memory, NAND flash memory, magnetoresistive random access memory (MRAM), spin transfer torque (STT)-MRAM, ferroelectric RAM (FeRAM), and phase change RAM (PRAM), resistive RAM (RRAM), nanotube RRAM, polymer RAM (PoRAM), nano-floating gate memory (NFGM), holographic memory, a molecular electronics memory device, or an Insulator resistance change memory.

Also, the memory device 100 may be implemented as a multi-rank including a plurality of ranks. Here, the rank refers to one block or region of data generated by using a part or the whole of a memory chip in one module. In an embodiment, the memory device 100 may receive a clock (CK[K:0], K is a positive integer) from the controller 200 through a channel.

Also, the memory device 100 may include a multiphase space skew adjuster 110 detecting and correcting a space skew of a multiphase signal. Here, the multiphase signal may be a clock (CK[K:0]) or may be generated using the clock (CK[K:0]). The multiphase space skew adjuster 110 may detect a skew between at least two of the phased signals of the multiphase clock. Here, the skew may be detected by being changed into a voltage by a low-pass filter and a level shifter including a resistor.

The memory controller 200 may be implemented as an integrated circuit, a system-on-chip (SoC), an application processor (AP), a mobile AP, a chipset, or a set of chips. The memory controller 200 may include a random access memory (RAM), a central processing unit (CPU), a graphics processing unit (GPU), a neural processing unit (NPU), or a modem. In an embodiment, the memory controller 200 may perform a function of a modem and a function of an AP.

Also, the memory controller 200 may be implemented to control the memory device 100 to read data stored in the memory device 100 or write data to the memory device 100. The memory controller 200 may control a write operation or a read operation with respect to the memory device 100 by providing a command CMD and an address ADD to the memory device 100 in synchronization with the clock CK[K:0]. Also, data DQs may be transmitted and received between the memory controller 200 and the memory device 100 in synchronization with a data transmission clock (e.g., WCK).

A general memory system serializes/deserializes data signals using a multiphase clock signal to achieve high speed read/write operations. In this case, a timing or a duty cycle of the multiphase clock signal may be incorrect, degrading signal quality. Meanwhile, the memory system according to an embodiment of the present inventive concept includes the memory device 100 having the multi-phase space skew adjuster 110, so that a quality of a high-speed signal may be guaranteed.

Meanwhile, the multiphase signal according to an embodiment of the present inventive concept may be a quadrature phase signal.

Figure 2:
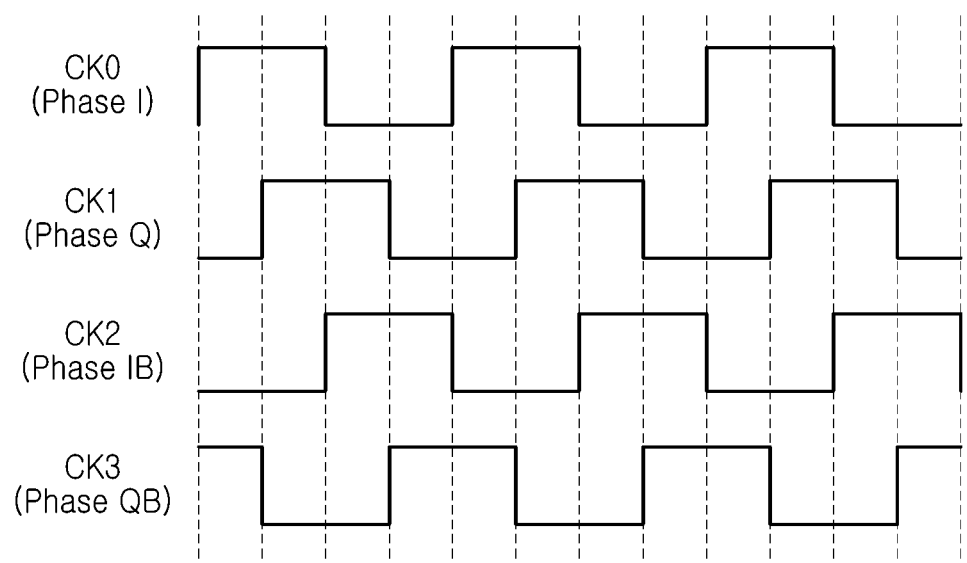
FIG. 2 is a diagram illustrating an embodiment of a multiphase signal CK[K:0] illustrated in FIG. 1.

FIG. 2 is a diagram illustrating an embodiment of a quadrature phase signal according to an embodiment of the present inventive concept. In FIG. 2, quadrature clock signals CK0, CK1, CK2, and CK3 are illustrated. Here, the four clock signals CK0, CK1, CK2, and CK3 have a phase difference of 90° from each other. For example, rising edges of the first clock signal CK0 (Phase I (in-phase)) and the second clock signal CK1 (Phase Q (quadrature phase)) have a phase difference of 90°, the rising edges of the second clock signal CK1 and the third clock signal CK2 (Phase IB (inverted in-phase)) have a phase difference of 90°, and rising edges of the third clock signal CK2 and the fourth clock signal CK3 (Phase QB (inverted quadrature phase) have a phase difference of 90°.

FIG. 2 illustrates that the multiphase clock signals CK0, CK1, CK2, and CK3 have the most ideal phase difference. However, the phase difference between the clock signals (CK0, CK1, CK2, and CK3) may not be maintained at 90° due to various noise within the memory device 100.

In an embodiment, the quadrature phase signal may be generated within the memory device 100 (refer to FIG. 1) using a clock signal and an inverted clock signal. In another embodiment, the quadrature phase signal may be directly received from the controller 200 (refer to FIG. 1).

Figure 3:
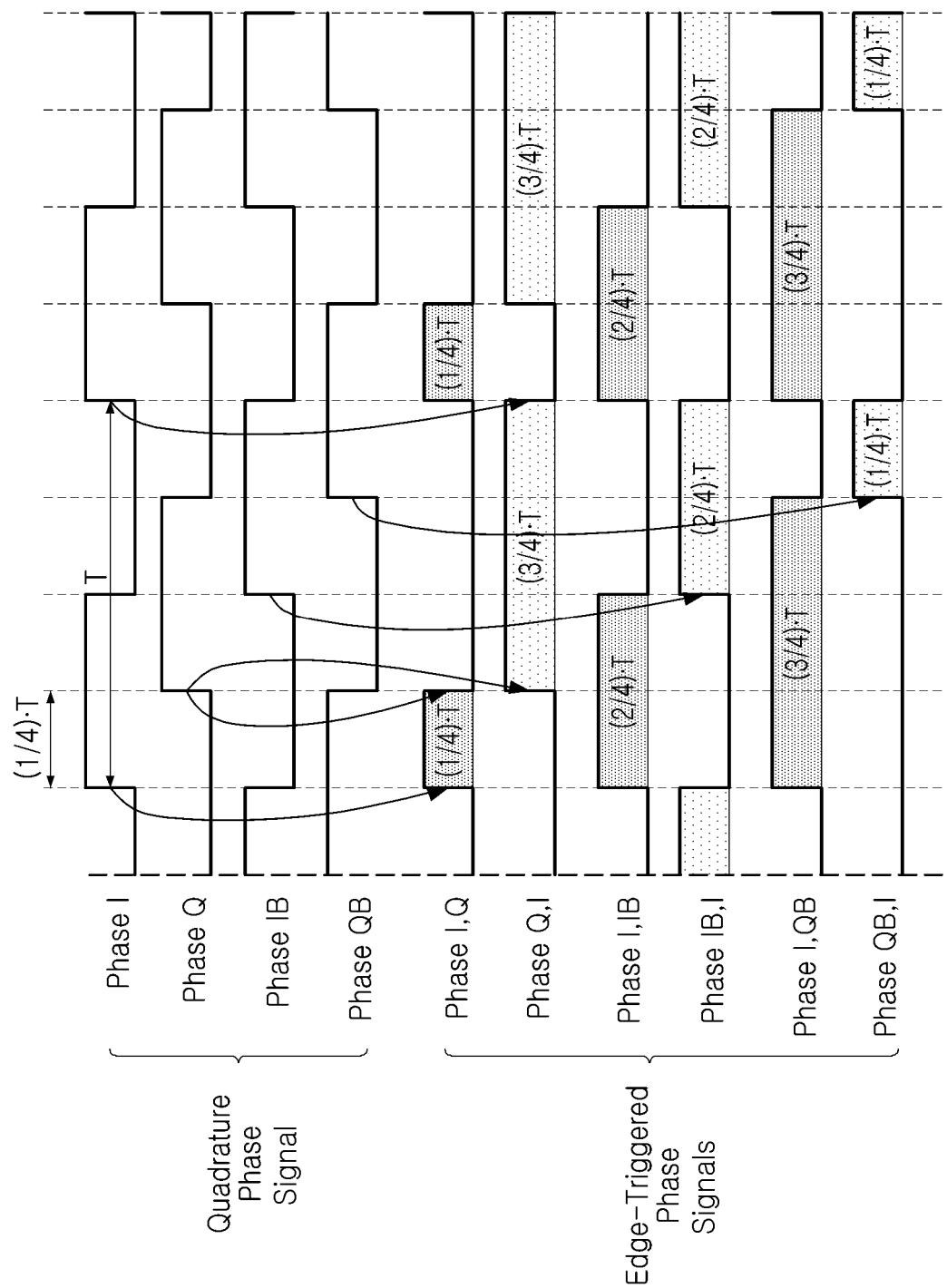
FIG. 3 is a diagram illustrating a process of generating a spacing signal of a quadrature phase signal according to an embodiment of the present inventive concept.

FIG. 3 is a diagram illustrating a process of generating a spacing signal of a quadrature phase signal according to an embodiment of the present inventive concept. As illustrated in FIG. 3, a period of the quadrature phase signal is T. Referring to FIG. 3, six edge-triggered phase signals may be generated according to four quadrature phase signals.

Also, a first edge-triggered phase signal (Phase I,Q) may be generated to have a first spacing (($\frac{1}{4}$)*T) from an edge of the in-phase signal (Phase I) to an edge of the quadrature signal (Phase Q). A second edge-triggered phase signal (Phase Q,I) may be generated to have a second spacing (($\frac{3}{4}$)*T) from an edge of the quadrature signal (Phase Q) to an edge of the in-phase signal (Phase I). A third edge-triggered phase signal (Phase I,IB) may be generated to have a third spacing (($\frac{2}{4}$)*T) from an edge of the in-phase signal (Phase I) to an edge of the inverted in-phase signal (Phase IB). A fourth edge-triggered phase signal (Phase IB,I) may be generated to have a fourth spacing (($\frac{2}{4}$))*T) from an edge of the inverted in-phase signal (Phase IB) to an edge of the in-phase signal (Phase I). The fifth edge-triggered phase signal (Phase I, QB) may be generated to have a fifth spacing (($\frac{3}{4}$)*T) from an edge of the in-phase signal (Phase I) to an edge of the inverted quadrature signal (Phase QB). The sixth edge-triggered phase signal (Phase QB,I) may be generated to have a sixth spacing (($\frac{1}{4}$))*T) from an edge of the inverted quadrature signal (Phase QB) to an edge of the in-phase signal (Phase I).

Figure 4:
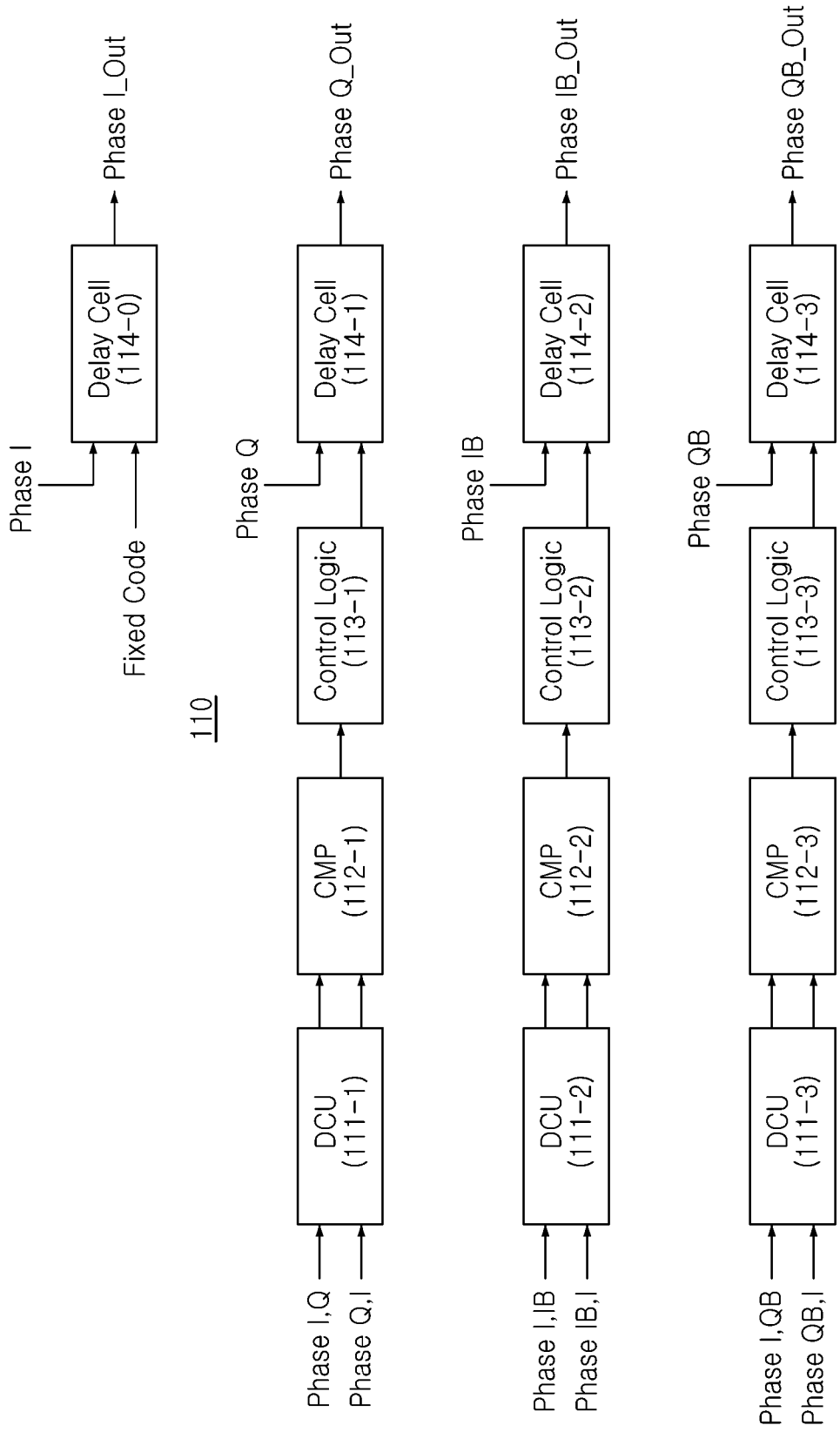
FIG. 4 is a diagram illustrating a multiphase space skew adjuster according to an embodiment of the present inventive concept.

FIG. 4 is a diagram illustrating the multiphase space skew adjuster (hereafter, "timing adjuster" or "skew corrector") 110 according to an embodiment of the present inventive concept. The timing adjuster 110 may include DC conversion units 111-1, 111-2, and 111-3, comparators 112-1, 112-2, and 112-3, control logics 113-1, 113-2, and 113-3, and delay cells 114-1, 114-2, and 114-3.

The first DC conversion unit 111-1 may be configured to receive the first edge-triggered phase signal (Phase I,Q) and the second edge-triggered phase signal (Phase Q,I), and converts each signal into a DC voltage.

The first comparator 112-1 may be configured to compare a first DC voltage with a second DC voltage from the first DC conversion unit 111-1. Here, the first DC voltage is a voltage corresponding to the first edge-triggered phase signal (Phase I,Q), and the second DC voltage is a voltage corresponding to the second edge-triggered phase signal (Phase Q,I). As illustrated in FIG. 4, two voltage levels passing through the DC conversion unit 111-1 may be compared in the comparator 112-1. Whether an error is greater than or less than 0 may be determined according to a comparison result. Here, if the error is 0, it indicates an ideal phase spacing. If the error is greater than 0, it indicates that the phase spacing is large. If the error is less than 0, it indicates that the phase spacing is small. In an embodiment, the first comparator 112-1 may be of either a synchronous type or a continuous type.

The first control logic 113-1 may be configured to generate a first delay code according to an output value from the first comparator 112-1. The first control logic 113-1 may be configured in the form of a digital filter. The first control logic 113-1 may control an update time. The first control logic 113-1 may receive a result from the first comparator 111-2 and may generate a control code (or a control signal) according to the number of bits of the delay cell 114-1 according to the received result.

The first delay cell 114-1 may be configured to output a quadrature phase signal Phase Q_Out by delaying the quadrature phase signal Phase Q by an amount corresponding to the first delay code. Accordingly, the quadrature phase signal Phase Q may be corrected according to a first space skew. It is noted that herein, when a phase signal is said to be delayed by a delay cell or the like, the delay may be a positive delay (a phase lag) or a negative delay (a phase lead) with respect to another phase signal. A negative delay may be effectuated by delaying a signal for more than one clock period.

The second DC conversion unit 111-2 may be configured to receive the third edge-triggered phase signal Phase I,IB and the fourth edge-triggered phase signal Phase IB,I and convert each thereof into a DC voltage. The second comparator 112-2 may be configured to compare a first DC voltage with a second DC voltage from the second DC conversion unit 111-2. Here, the first DC voltage is a voltage corresponding to the third edge-triggered phase signal Phase I,IB, and the second DC voltage is a voltage corresponding to the fourth edge-triggered phase signal Phase IB,I. The second control logic 113-2 may be configured to generate a second delay code according to an output value from the second comparator 112-2. The second control logic 113-2 may control an update time. The second control logic 113-2 may receive a result from the second comparator 112-2 and may generate a signal according to the number of bits of the second delay cell 114-2 according to the received result. The second delay cell 114-2 may be configured to output an inverted in-phase signal Phase I_Out by delaying the inverted in-phase signal Phase IB by an amount corresponding to the second delay code. Accordingly, the inverted in-phase signal Phase IB may be corrected according to a second space skew.

The third DC conversion unit 111-3 may be configured to receive a fifth edge-triggered phase signal Phase I, QB and a sixth edge-triggered phase signal Phase QB, I and convert each thereof into a DC voltage. The third comparator 112-3 may be configured to compare a first DC voltage with a second DC voltage from the third DC conversion unit 111-3. Here, the first DC voltage is a voltage corresponding to the fifth edge-triggered phase signal (Phase I,QB), and the second DC voltage is a voltage corresponding to the sixth edge-triggered phase signal Phase QB,I. The third control logic 113-3 may be configured to generate a third delay code according to an output value from the third comparator 112-3. The third control logic 113-3 may control an update time. The third control logic 113-3 may receive a result from the third comparator 112-3 and may generate a signal according to the number of bits of the third delay cell 114-3 according to the received result. The third delay cell 114-3 may be configured to output an inverted quadrature phase signal Phase QB_Out by delaying the inverted quadrature phase signal Phase QB by an amount corresponding to the third delay code. Accordingly, the inverted quadrature phase signal Phase QB may be corrected according to a third space skew.

Also, the delay cell 114-0 may output an in-phase signal Phase I_Out by delaying the in-phase signal Phase I by an amount corresponding to a fixed code.

As described above, the multiphase space skew adjuster 110 may correct a space skew between two phase signals of a multiphase clock signal, such that the phases of two phase signals are corrected to target phases (e.g., 90 degrees or ¼ of a clock cycle period between the Phase I and Phase Q signals having the same period).

Figure 5:
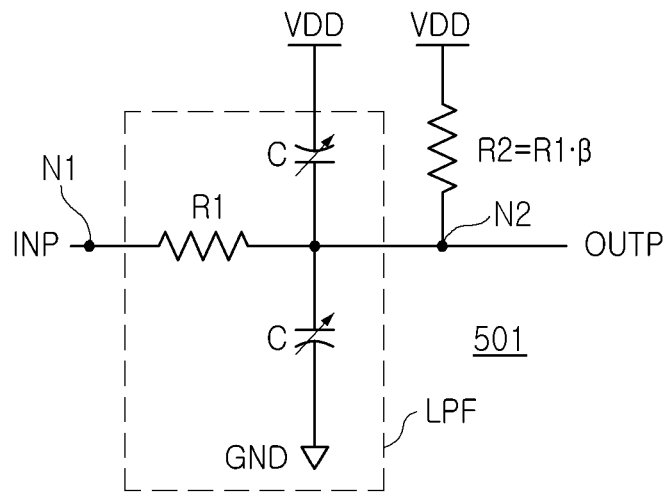
FIG. 5 is a diagram illustrating a direct current conversion unit (DCU) according to an embodiment of the present inventive concept.
Figure 5:
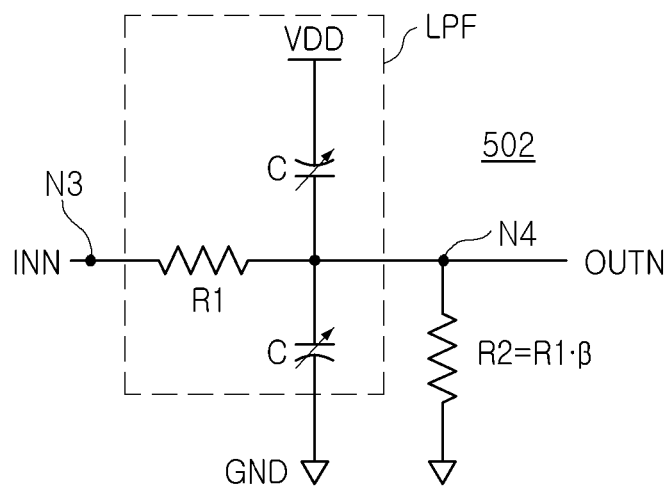

FIG. 5 is a diagram illustrating a direct current conversion unit (DCU) according to an embodiment of the present inventive concept. The DC conversion unit DCU may include a first circuit part 501 and a second circuit part 502. The first and second circuit parts 501 and 502 may each include a first resistor R1, a second resistor R2, and two capacitors C. The DC conversion unit DCU may generate output voltages OUTP and OUTN corresponding to input voltage INP and INN, respectively, using a low-pass filter configured with the first resistor R1 and one of the capacitors C and a level shifter that divides a power supply voltage VDD to the second resistor R2. (Resistors R1 and R2 are understood as having respective resistance values R1 and R2.) Here, the input voltages INP and INN may be voltages of edge-triggered phase signals (e.g., Phase I,Q and Phase Q,I, respectively). The second resistor R2 satisfies the following equation.

$$R2 = R1 \cdot \beta \quad \text{[Equation 1]}$$

Here, β is a value that causes a voltage filtered by the low-pass filter (LPF) to equal VDD/2 when the two phase signals have target (ideal) relative phases with respect to each other, and to be approximately equal to VDD/2 when the relative phases are close to the target. β may vary depending on a selected adjacent phase signal. For example, when the adjacent phase signal is "Phase 0, α", β=(1−½)/(½−α/N), where N is the number of multiphase signals. However, when α=(½)·N, β=0. Thus, R2 may be determined as a value obtained by multiplying a factor β required to cause a corresponding voltage, among the first voltage and the second voltage, to equal VDD/2 when relative timing between the two phase signals is ideal, due to a voltage drop across the resistor R1.

As shown in FIG. 5, the DC conversion unit DCU may include the first circuit part 501 including the first resistor R1 which receives the first edge-triggered phase signal INP from a first input node N1 and outputting a first voltage OUTP to a first output node N2, and a second resistor R2 connected between the power supply terminal VDD and the first output node N2. The second circuit part 502 may include a third resistor (also labeled R1) receiving a second edge-triggered phase signal INN from a second input node N3 and outputting a second voltage OUTN to a second output node N4, and a fourth resistor (also labeled R2) connected to the second output node N4. The first circuit part 501 may include a first capacitor C connected between the first output node N2 and the power supply terminal VDD, and a second capacitor C connected between the first output node N2 and a ground terminal GND. The second circuit part 502 may include a third capacitor C connected between the second output node N4 and ground terminal GND, and a fourth capacitor connected between the second output node N4 and the power supply terminal VDD. In an embodiment, a resistance value of each of the first resistor and the third resistor may be R1, and a resistance value of each of the second resistor and the fourth resistor may be R2. In an embodiment, a capacitance value of each of the first to fourth capacitors may be C.

Meanwhile, the DC conversion unit (DCU) according to an embodiment of the present inventive concept may be configured in a cascade form (e.g., in the embodiment of FIG. 6) so as to speed up a settling time while minimizing ripples of the low-pass filter.

Figure 6:
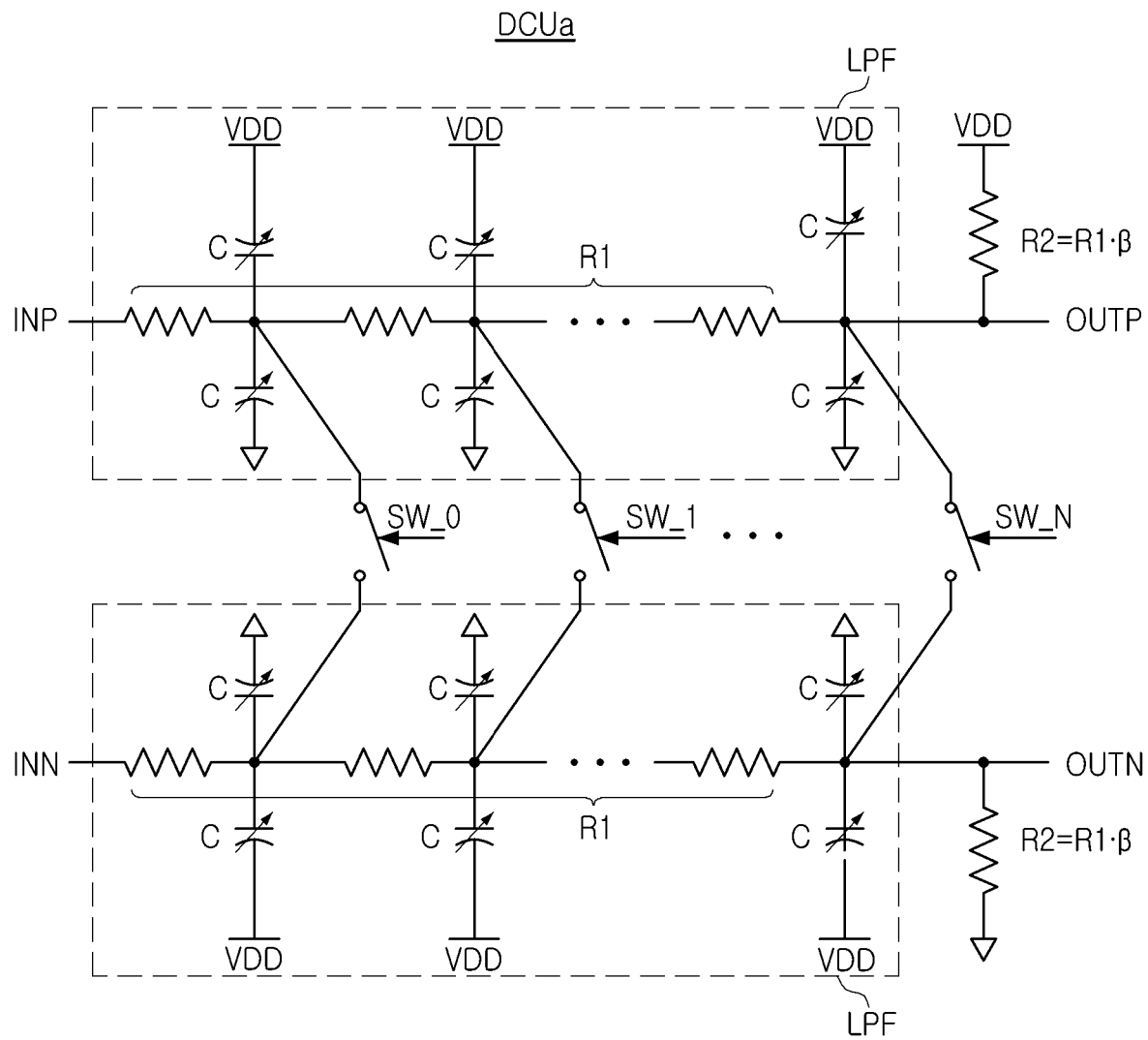
FIG. 6 is a diagram illustrating a direct current conversion unit (DCUa) according to another embodiment of the present inventive concept.

FIG. 6 is a diagram illustrating a DC conversion unit DCUa according to another embodiment of the present inventive concept. DC conversion unit DCUa may include a low-pass filter LPF implemented in a cascade form with a plurality of resistor and capacitor pairs in each of a plurality of stages. Switches SW_0 to SW_N may have the same initial voltage, thereby speeding up a settling time. A switch SW_i (i=any of 0 to N) of each stage may be variably disposed, and may activate two of the resistor and capacitor pairs. (The plurality of switches may activate each of the plurality of resistor and capacitor pairs.)

A multiphase space skew adjuster according to an embodiment of the present inventive concept (as in FIG. 7 discussed next) may be configured to sequentially receive and compare output values of a plurality of DC conversion units.

Figure 7:
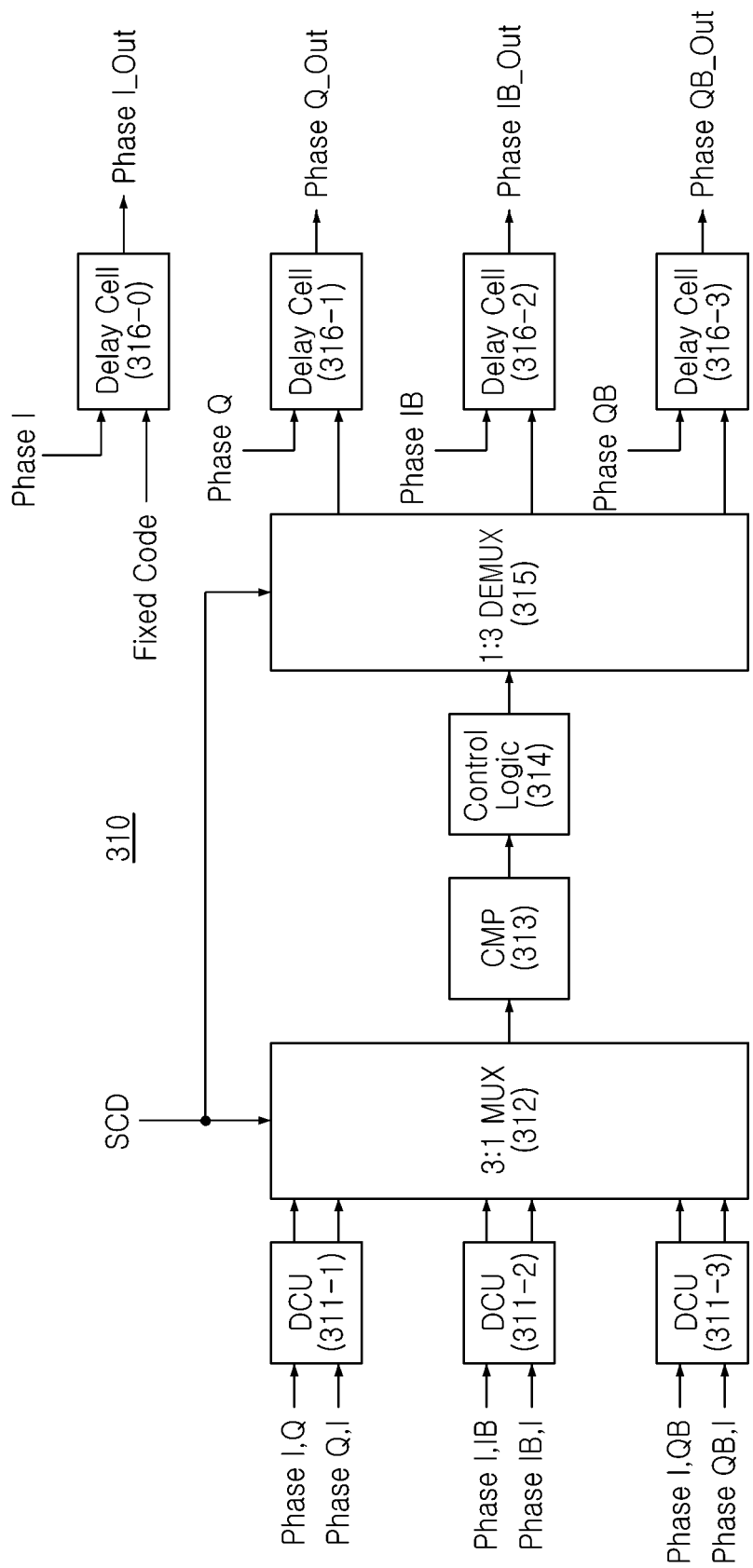
FIG. 7 is a diagram illustrating a multiphase space skew adjuster according to another embodiment of the present inventive concept.

FIG. 7 is a diagram illustrating a multiphase space skew adjuster (interchangeably, "timing adjustor" or "skew corrector") 310 according to another embodiment of the present inventive concept. Skew corrector 310 may include DC conversion units 311-1, 311-2, and 311-3, a 3:1 multiplexer (MUX) 312, a comparator 313, control logic 314, a 1:3 demultiplexer (DEMUX) 315, and delay cells (circuits) 316-1, 316-2, and 316-3.

Each of the DC conversion units 311-1 to 311-3 may be configured the same as the DC conversion unit DCU illustrated in FIG. 5. The multiplexer 312 may select output values of one of the DC conversion units 311-1 to 311-3 in response to a selection code SCD. The comparator 313 may be configured the same as any of the comparators CMP 112-1 to 112-3 illustrated in FIG. 4. The control logic 314 may be configured the same as the control logic illustrated in FIG. 4. The de-multiplexer DEMUX 315 may provide an output value from the control logic 314 to a corresponding delay cell among the delay cells 316-1, 316-2, and 316-3 according to the selection code SCD.

Each of the delay cells 316-1, 316-2, and 316-3 may delay a corresponding phase signal in response to a control code received from the demultiplexer 315. Also, a delay cell 316-0 may output the in-phase signal Phase I_Out by delaying the in-phase signal Phase I by an amount corresponding to a fixed code.

As described above, a multiphase space skew adjuster according to an embodiment of the present inventive concept may generate pairs of pulse trains (e.g., signals Phase I,Q and Phase Q,I of FIG. 3), where each pulse train of a pair is based on rising edges of two phase signals of the multiphase signal (e.g., signals Phase I and Phase Q of FIG. 3); extract DC voltages after the pairs of pulse trains pass through respective low-pass filters (e.g., the LPFs of circuit parts 501 and 502 of FIG. 5), perform level-shifting so that the two extracted DC voltages are approximately equal to each other using a resistor, and compare the shifted voltages. The low-pass filters may be implemented in independent form (as in FIG. 5) or in a cascade form (as in FIG. 6).

Meanwhile, in FIGS. 3 to 7, the illustrated multiphase signal is a quadrature phase signal. However, it should be understood that the number of phases of the multiphase signal of the present inventive concept is not limited thereto.

Figure 8:
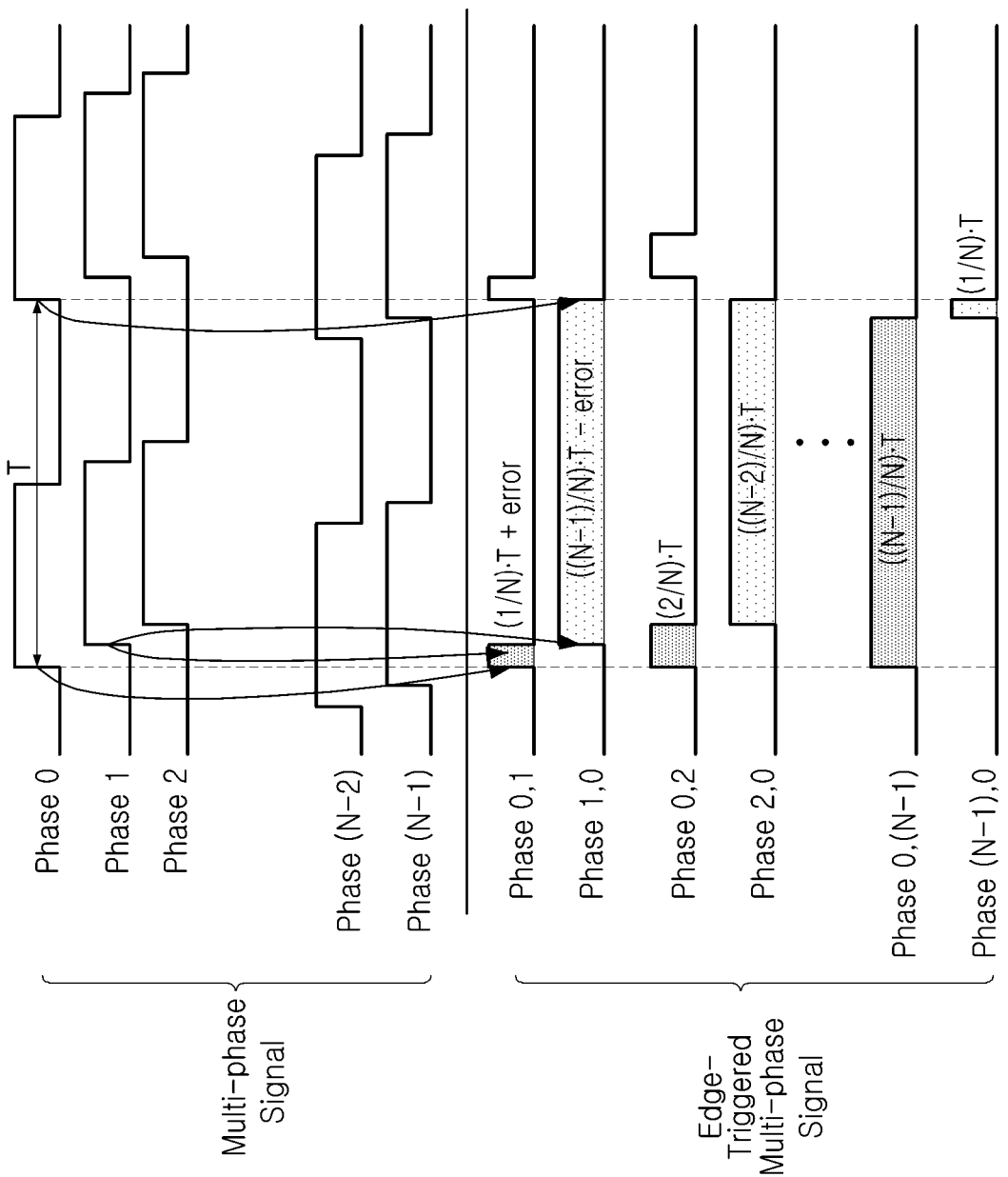
FIG. 8 is a diagram illustrating a process of generating an edge-triggered multiphase signal according to another embodiment of the present inventive concept.

FIG. 8 is a diagram illustrating a process of generating an edge-triggered multiphase signal according to another embodiment of the present inventive concept. Referring to FIG. 8, the process of generating an edge-triggered multiphase signal is expanded to N (N is an integer greater than or equal to 2) compared to that illustrated in FIG. 3. As illustrated in FIG. 8, N multiphase signals are illustrated. Each of the multiphase signals has a phase difference of T/N from the adjacent phase signal.

The sum of a first spacing ((1/N)*T+error) of the first edge-triggered multiphase signal Phase 0,1 and a second spacing (((N−1)/N)*T−error) of the second edge-triggered multiphase signal (Phase 1,0) is a period T of the multiphase signal. The sum of a third spacing ((2/N)*T+error) of the third edge-triggered multiphase signal (Phase 0,2) and a second spacing of the fourth edge-triggered multiphase signal (Phase 2,0) is the period T of the multiphase signal. Similarly, the sum of a (2N−1)-th spacing (((N−1)/N)*T+error)) of an (2N−1)-th edge-triggered multiphase signal Phase 0,N−1 and a 2N-th spacing ((1/N)*T−error) of an 2N-th edge-triggered multiphase signal Phase N−1,0 is the period T of the multiphase signal.

Figure 9:
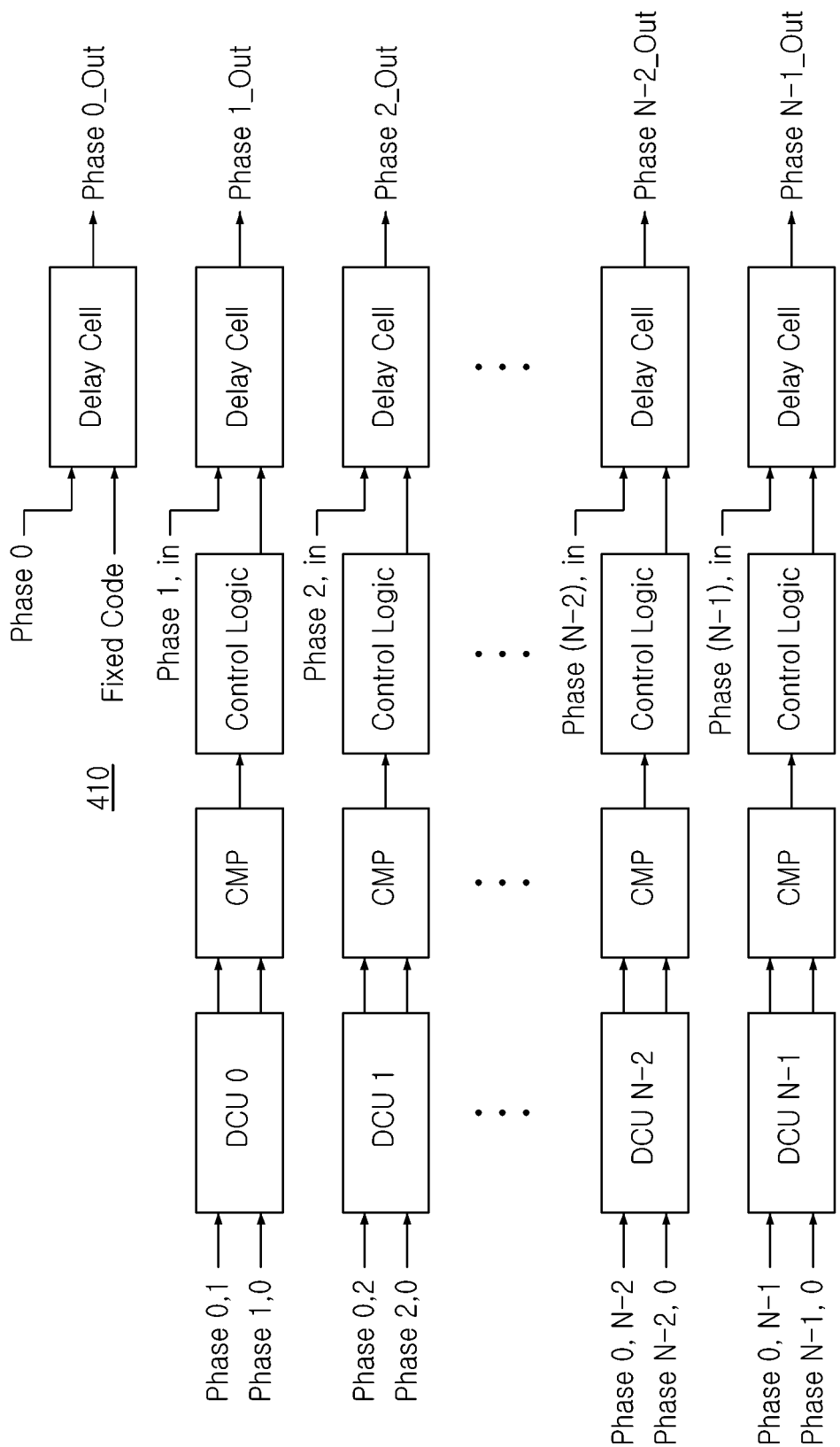
FIG. 9 is a diagram illustrating a multiphase tspace skew adjuster according to another embodiment of the present inventive concept.

FIG. 9 is a diagram illustrating a multiphase space skew adjuster (interchangeably, just "timing adjustor" or "skew corrector") 410 according to another embodiment of the present inventive concept. Timing adjuster 410 has a structure expanded to N phases, compared to the multiphase space skew adjuster 110 illustrated in FIG. 4. For example, each of the plurality of DCUs may receive corresponding edge-triggered multiphase signals and output DC voltages corresponding to a spacing error or space skew.

Figure 10A:
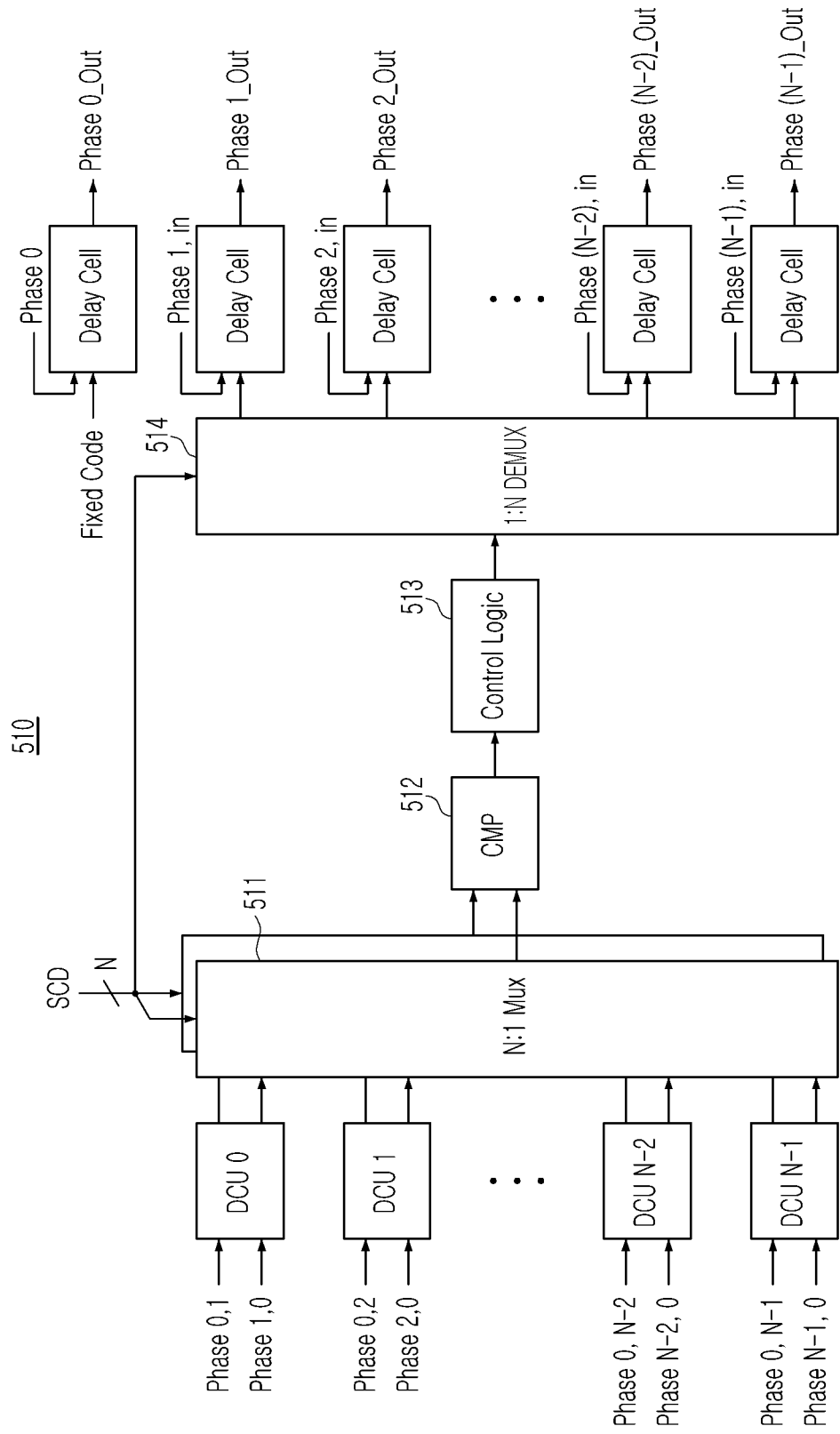
FIG. 10A is a diagram illustrating a multiphase space skew adjuster according to another embodiment of the present inventive concept.

FIG. 10A is a diagram illustrating a multiphase space skew adjuster 510 according to another embodiment of the present inventive concept. The timing adjuster 510 has a structure expanded to N phases, compared to the multiphase timing adjuster 310 illustrated in FIG. 7. The timing adjuster 510 may include a plurality of DC conversion units (DCU 0 to DCU N−1), an N:1 MUX 511, a comparator 512, a control logic 513, a 1:N MUX 514, and a plurality of delay cells (delay circuits). As illustrated in FIG. 10, the selection code SCD may be N-bit data. The N:1 MUX 511 may sequentially output the respective output voltages from the DC conversion units DCUs to the comparator according to the selection code SCD. The 1:N MUX 514 may output an output value of the control logic to a corresponding delay cell according to the selection code SCD.

Meanwhile, in another example, a multiphase space skew adjuster according to an embodiment of the present inventive concept may be configured to have a structure sharing one DC conversion unit.

Figure 10B:
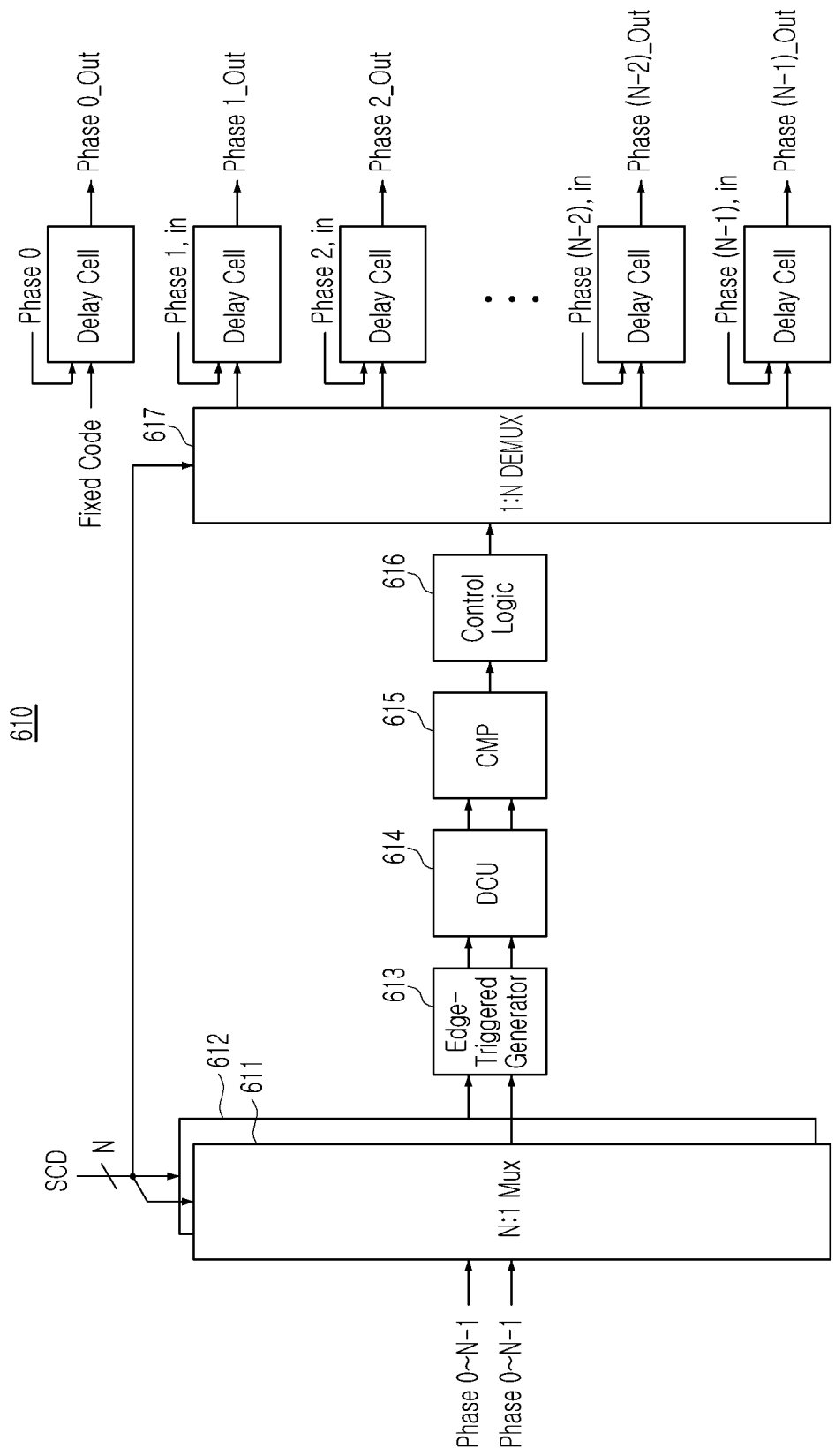
FIG. 10B is a diagram illustrating a multiphase space skew adjuster according to another embodiment of the present inventive concept.

FIG. 10B is a diagram illustrating a multiphase space skew adjuster 610 according to another embodiment of the present inventive concept. The timing adjuster 610 includes a first N:1 MUX 611, a second N:1 MUX 612, an edge-triggered generator 613, a DC conversion unit 614, a comparator 615, a control logic 616, a 1:N MUX 617, and a plurality of delay cells.

The first N:1 MUX 611 may output one of the plurality of phase signals Phase 0 to Phase N−1 in response to the selection code SCD. The second N:1 MUX 612 may output one of the plurality of phase signals Phase 0 to Phase N−1 in response to the selection code SCD. Here, each of the first and second N:1 MUXs 611 and 612 may select and output different phase signals in response to the selection code SCD.

The edge-triggered generator 613 may generate two edge-triggered multiphase signals as shown in FIG. 3 or 8 using the phase signals selected from the first and second N:1 MUXs 611 and 612.

The DC conversion unit 614 may receive the receive edge-triggered multiphase signals and convert them into DC voltages. The comparator 615 may compare the converted DC voltages. The control logic 616 may generate a control code according to a comparison result from the comparator 615. The 1:N MUX 617 may output a control code from the control logic 616 to a corresponding delay cell in response to the selection code SCD. Each of the delay cells may adjust a timing (correct a skew) of the phase signal by delaying the phase signal in response to the control code.

Figure 11:
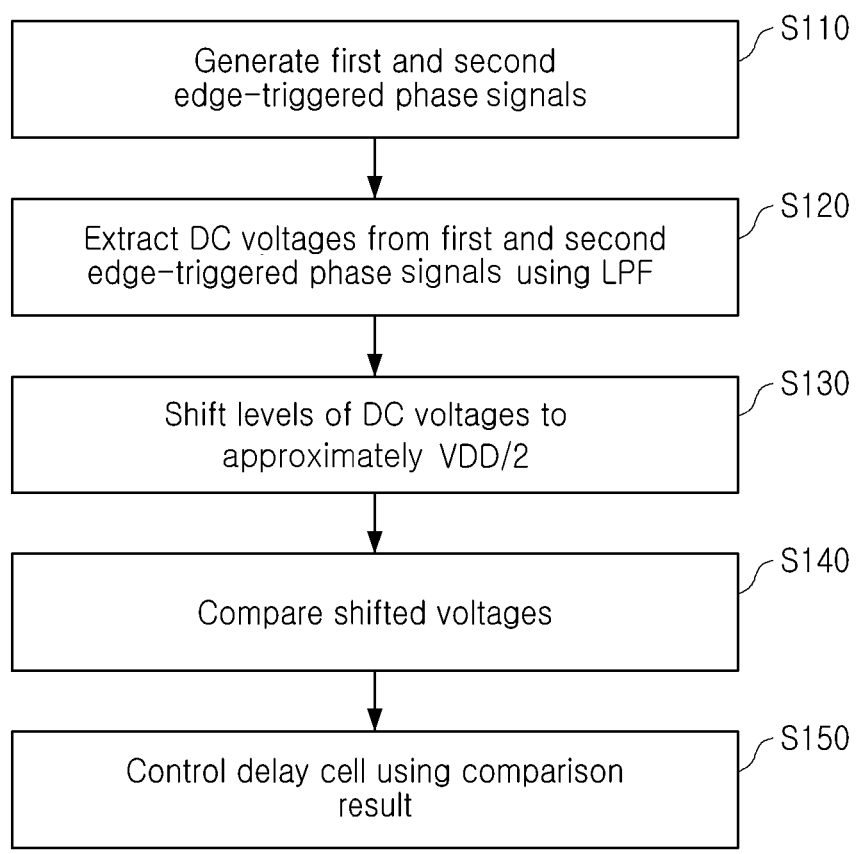
FIG. 11 is a flowchart illustrating an operating method of a memory device according to an embodiment of the present inventive concept.

FIG. 11 is a flowchart illustrating an operating method of a memory device according to an embodiment of the present inventive concept. Referring to FIGS. 1 to 11, a memory device according to an embodiment of the present inventive concept may operate as follows.

The memory device 100 may generate first and second edge-triggered phase signals (S110). The memory device 100 may extract DC voltages corresponding to the duty cycle from the first and second edge-triggered phase signals using the low-pass filter (LPF) (S120). The memory device 100 may convert the extracted DC voltages to VDD/2 using a level shifter (S130). The memory device 100 may compare the converted voltages (S140). The memory device 100 may control the delay cell according to a comparison result in order to correct the multiphase clock (S150).

In an embodiment, the sum of the spacing of adjacent phases and the spacing of the remaining phases is the period of the multiphase signal. In an embodiment, each of the DC voltages may be level-shifted to VDD/2 using a resistor. In an embodiment, the synchronous type or continuous type comparator may determine whether a difference between the level-shifted voltages is greater than 0. In an embodiment, the digital filter type control logic may generate a control code according to the number of bits of the delay cell by controlling an update time according to the comparison result.

Figure 12:
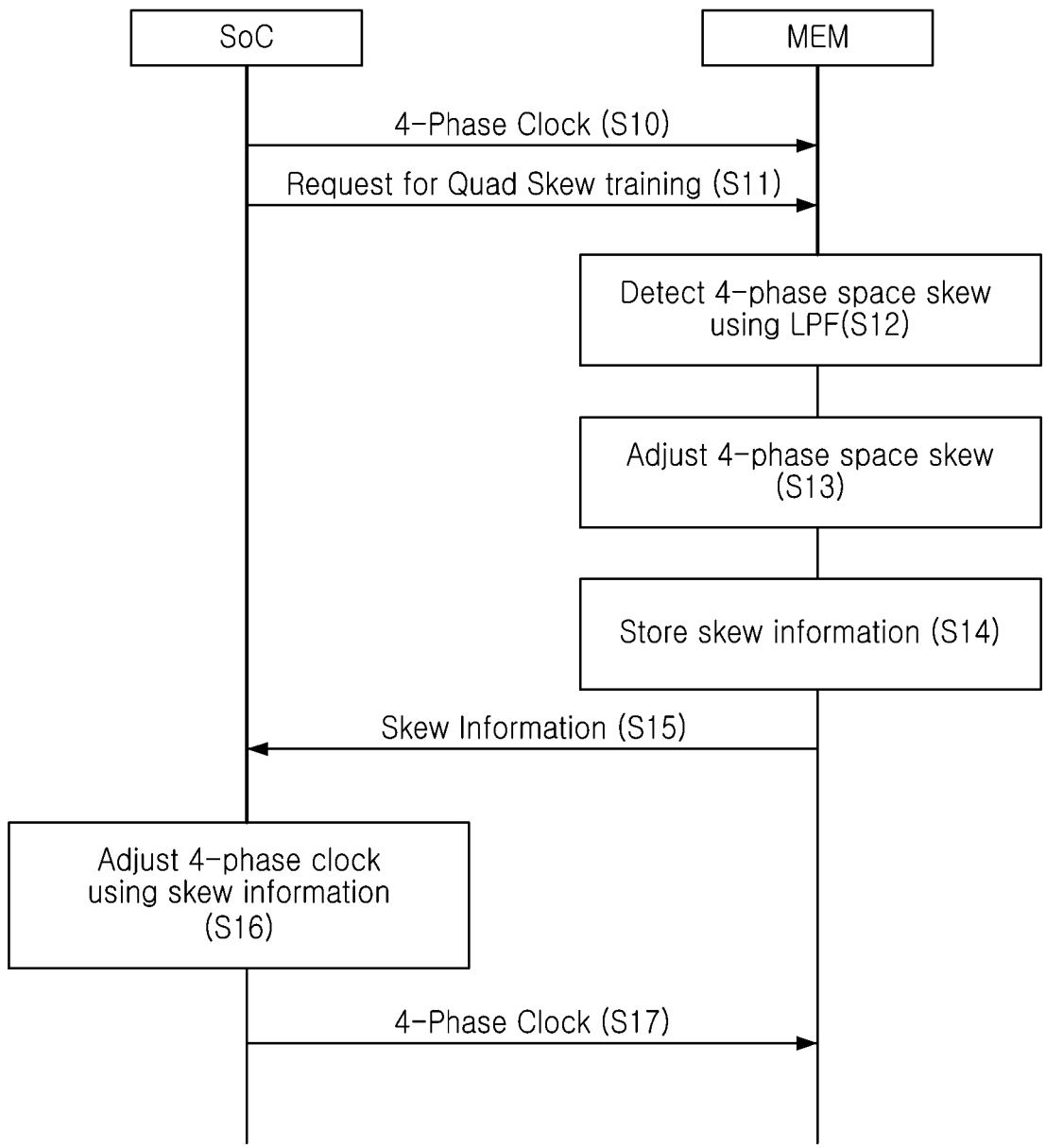
FIG. 12 is a ladder diagram illustrating a clock training process of a memory system according to an embodiment of the present inventive concept.

FIG. 12 is a ladder diagram illustrating a clock training process of a memory system according to an embodiment of the present inventive concept. Referring to FIGS. 1 to 12, a training process for a clock of the memory system may be performed as follows.

The controller SoC (refer to FIG. 1) 200 may transmit a quadrature phase clock to the memory device MEM (refer to FIG. 1) 100 (S10). The controller SoC may request training for the quadrature phase clock from the memory device MEM (S11). The memory device MEM may detect a space skew of the 4-phase clock by using the low-pass filter (LPF) in response to the training request for the quadrature phase clock (S12). Here, the space skew may be detected by a DC conversion unit (DCU) using an LPF and a resistance-based level shifter. The memory device MEM may adjust the quad skew according to the detected space skew (S13). At the same time, the memory device MEM may store information corresponding to the skew of the quadrature phase clock (S14). The controller SoC may read the skew information from the memory device MEM (S15). The controller SoC may adjust the quadrature phase clock using the skew information (S16). The controller SoC may output the adjusted quadrature phase clock to the memory device MEM (S17).

Figure 13:
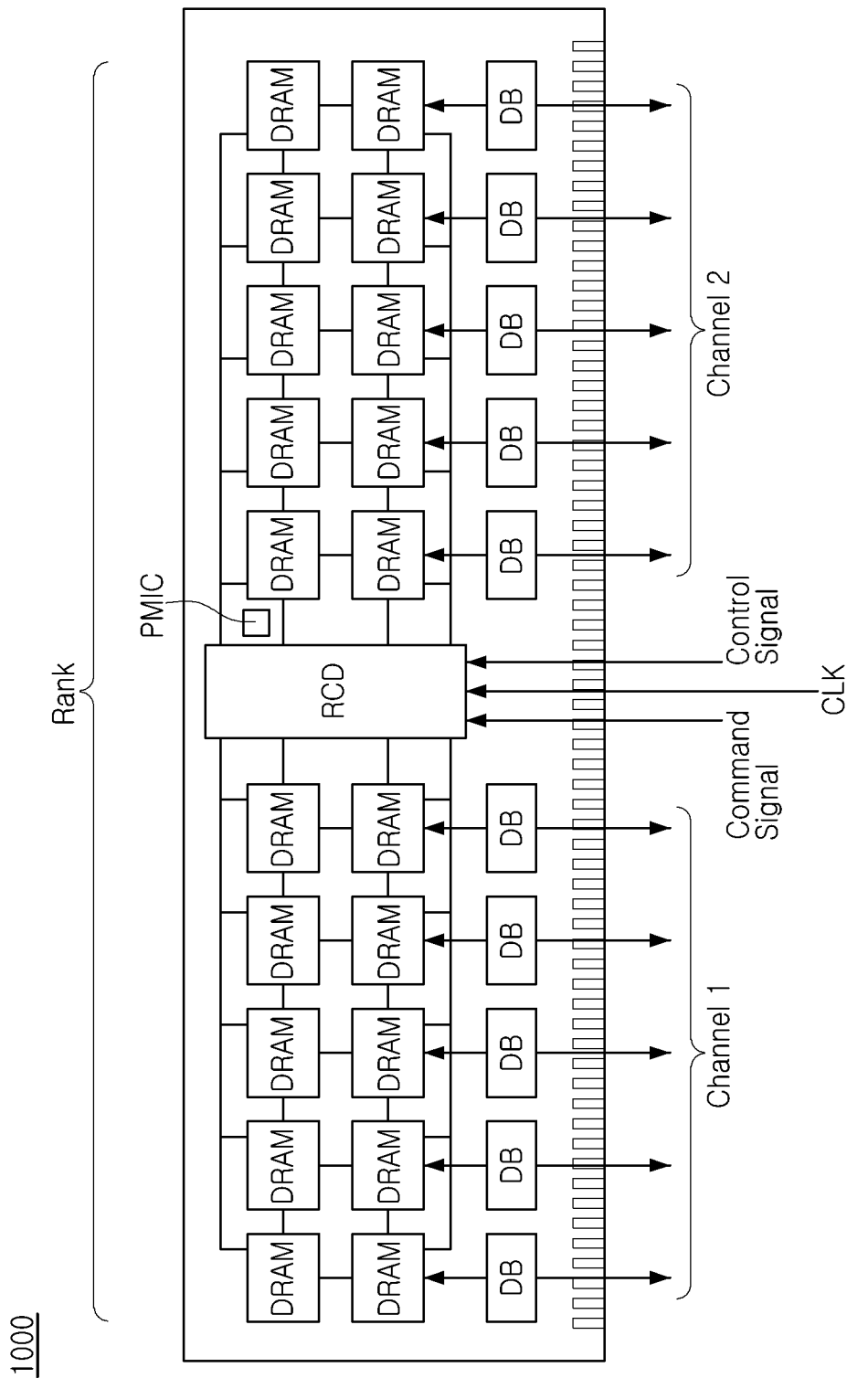
FIG. 13 is a diagram illustrating a memory module according to an embodiment of the present inventive concept.

FIG. 13 is a diagram illustrating a memory module 1000 according to an embodiment of the present inventive concept. Referring to FIG. 13, the memory module 1000 may include a plurality of memory chips (DRAMs) each including a memory cell array, a buffer chip (RCD) for routing transmission/reception signals with the memory controller or managing memory operations for the memory chips, and a power management chip (PMIC). The RCD may control the memory chips (DRAM) and the power management chip (PMIC) under the control of the memory controller. For example, the RCD may receive a command signal, a control signal, and a clock signal from the memory controller.

The memory chips DRAM may be connected to corresponding data buffers DB through corresponding data transmission lines, respectively, to transmit/receive a data signal DQ and a data strobe signal DQS. The memory chips DRAM may be connected to the data buffers DB through corresponding data transmission lines, respectively, to transmit/receive parity data and the data strobe signal DQS.

An SPD chip (not shown) may be an electrically erasable programmable read-only memory (EEPROM). The SPD chip may include initial information or device information of the memory module 1000. For example, an SPD chip 580 may include initial information or device information such as a module type, a module configuration, a storage capacity, a module type, and an execution environment of the memory module 500. When the memory system including the memory module 1000 is booted, the memory controller may read the device information from the SPD chip and recognize the memory module based on the read device information.

The memory module 1000 may include a plurality of ranks. In an embodiment, each of the plurality of ranks may include eight bank groups. Each of the bank groups may include four banks. In an embodiment, the memory chips may be divided into first channel-only memory chips and second channel-only memory chips.

Meanwhile, each of the plurality of ranks may be configured to receive a multiphase clock, detect a space skew, and adjust a skew according to the detected space skew, as described above with reference to FIGS. 1 to 12.

Figure 14:
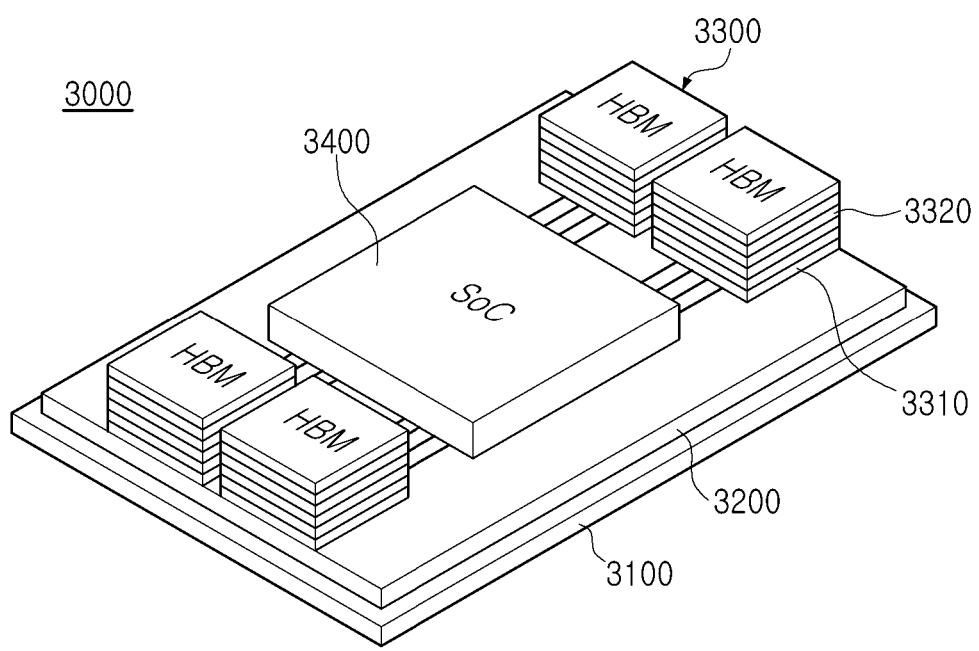
FIG. 14 is a diagram illustrating a semiconductor package according to an embodiment of the present inventive concept.

FIG. 14 is a diagram illustrating a semiconductor package according to an embodiment of the present inventive concept. Referring to FIG. 14, a semiconductor package 3000 may be a memory module including at least one stack semiconductor chip 3300 and a system-on-chip (SOC) 3400 mounted on a package substrate 3100 such as a printed circuit board. An interposer 3200 may be selectively further provided on the package substrate 3100. The stack semiconductor chip 3300 may be formed of chip-on-chip (CoC). The stack semiconductor chip 3300 may include a multiphase space skew adjuster receiving a multiphase clock, detecting a space skew, and adjusting the space skew as described above with reference to FIGS. 1 to 12.

The stack semiconductor chip 3300 may include at least one memory chip 3320 stacked on a buffer chip 3310 such as a logic chip. The buffer chip 3310 and the at least one memory chip 3320 may be connected to each other by a through-silicon via (TSV). The buffer chip 3310 may perform a training operation on the memory chip 3320. The stack semiconductor chip 3300 may be, for example, a high bandwidth memory (HBM) of 500 GB/sec to 1 TB/sec, or greater.

A memory system according to an embodiment of the present inventive concept is a system in synchronization with a multiphase clock to exchange data, and may include a semiconductor device outputting a clock and a semiconductor device receiving the clock. In an embodiment, the semiconductor device receiving the clock may include a circuit for detecting or monitoring a space skew of a multiphase clock.

The memory device according to an embodiment of the present inventive concept may detect a multiphase clock error by converting it into a voltage using a low-pass filter and a level shifter using a resistor. In the memory device according to an embodiment of the present inventive concept, only a minute register mismatch may occur in adjusting the clock error by using the low-pass filter and the level shifter including a resistor.

While example embodiments have been illustrated and described above, it will be apparent to those skilled in the art that modifications and variations could be made without departing from the scope of the present inventive concept as defined by the appended claims.

What is claimed is:

1. A memory device comprising:
an edge-triggered generator configured to generate first and second edge-triggered phase signals;
a DC conversion circuit configured to receive the first edge-triggered phase signal, which has first pulses each extending from a rising edge of a first phase signal of a multiphase clock to a later rising edge of a second phase signal of the multiphase clock, and the second edge-triggered phase signal, which has second pulses each extending from a rising edge of the second phase signal to a later rising edge of the first phase signal, and to output a first voltage corresponding to the first edge-triggered phase signal and a second voltage corresponding to the second edge-triggered phase signal;
a comparator configured to compare the first voltage with the second voltage;
control logic configured to generate a control code corresponding to an output value from the comparator; and
a delay circuit configured to delay the second phase signal according to the control code,
wherein the DC conversion circuit includes a first low-pass filter configured to extract a DC voltage from the first edge-triggered phase signal, a second low-pass filter configured to extract a DC voltage from the second edge-triggered phase signal, and first and second level shifters outputting the first voltage and the second voltage, respectively, by changing levels of the DC voltages extracted from the low-pass filters using a respective resistor.

2. The memory device of claim 1, wherein a period of each of the first phase signal and the second phase signal is T, and a sum of a pulsewidth of any of the first pulses and a pulsewidth of any of the second pulses is T.

3. The memory device of claim 1, wherein
the first phase signal is an in-phase signal, and
the second phase signal is one of a quadrature phase signal, an inverted in-phase signal, or an inverted quadrature signal.

4. The memory device of claim 1, wherein the DC conversion circuit includes a first low-pass filter configured to extract a DC voltage from the first edge-triggered phase signal, and a second low-pass filter configured to extract a DC voltage from the second edge-triggered phase signal.

5. The memory device of claim 4, wherein the DC conversion circuit further includes first and second level shifters outputting the first voltage and the second voltage, respectively, by changing levels of the DC voltages extracted from the low-pass filters.

6. The memory device of claim 5, wherein each of the first and second level shifters changes a level of a DC voltage corresponding to half of a power supply voltage based on resistance division.

7. The memory device of claim 4, wherein each of the first and second low-pass filters includes a plurality of resistor and capacitor pairs connected in a cascade form and further includes a plurality of switches activating each of the plurality of resistor and capacitor pairs.

8. The memory device of claim 1, wherein
the DC conversion circuit includes:
a first resistor receiving the first edge-triggered phase signal from a first input node and outputting the first voltage to a first output node;
a second resistor connected between a power supply terminal and the first output node;
a third resistor receiving the second edge-triggered phase signal from a second input node and outputting the second voltage to a second output node;
a fourth resistor connected to the second output node;
a first capacitor connected between the first output node and the power supply terminal;
a second capacitor connected between the first output node and a ground terminal;
a third capacitor connected between the second output node and the power supply terminal; and
a fourth capacitor connected between the second output node and the ground terminal.

9. The memory device of claim 8, wherein
each of the first and third resistors has a first resistance value,
each of the second and fourth resistors has a second resistance value, and
each of the first to fourth capacitors has the same capacitance value.

10. The memory device of claim 9, wherein the second resistance value is determined as a value obtained by multiplying a factor required to cause a corresponding voltage, among the first voltage and the second voltage, to equal half a power supply voltage, due to a voltage drop across the first resistor.

11. A memory device comprising:
a plurality of DC conversion circuits each configured to output a first voltage and a second voltage corresponding to a spacing error of two phase signals among a plurality of phase signals;
a multiplexer configured to sequentially output the first voltage and the second voltage from each of the plurality of DC conversion circuits in response to a selection code;
a comparator configured to compare the first voltage with the second voltage output from the multiplexer;
control logic configured to generate a control code corresponding to an output value from the comparator; and
a demultiplexer configured to output the control code to a corresponding delay circuit, among a plurality of delay circuits, in response to the selection code.

12. The memory device of claim 11, wherein the plurality of phase signals are quadrature phase signals.

13. The memory device of claim 11, wherein each of the plurality of DC conversion circuits includes:
a first capacitor connected between a first output node and a power supply terminal; and
a second capacitor connected between the first output node and a ground terminal.

14. The memory device of claim 11, wherein each of the plurality of DC conversion circuits outputs the first voltage and the second voltage by filtering each of the two phase signals using a low-pass filter and level-shifting each of the filtered two phase signals using a resistor.

15. The memory device of claim 14, wherein the low-pass filter is implemented in a cascade form with a plurality of resistor and capacitor pairs to speed up a settling time, and includes a plurality of switches activating each of the plurality of resistor and capacitor pairs.

16. An operating method of a memory device, the operating method comprising:
generating first and second edge-triggered phase signals based on a first phase signal having a period and a second phase signal having the period;
extracting DC voltages from each of the first and second edge-triggered phase signals using a respective low-pass filter;
level-shifting each of the extracted DC voltages to a fraction of a power supply voltage using a resistor;
comparing the level-shifted voltages; and
controlling a delay circuit for delaying the second phase signal according to a comparison result.

17. The operating method of claim 16, wherein a sum of a pulsewidth of any of a plurality of pulses of the first edge-triggered phase signal and a pulsewidth of any of a plurality of pulses of the second edge-triggered phase signal equals the period.

18. The operating method of claim 16, wherein the level-shifting includes level-shifting each of the extracted DC voltages using a resistor.

19. The operating method of claim 16, wherein the comparing of the level-shifted voltages includes determining by a synchronous type or continuous type comparator whether a difference between the level-shifted voltages is greater than 0.

20. The operating method of claim 16, wherein the controlling of the delay circuit includes generating a control code according to a number of bits of the delay circuit by controlling an update time in a digital filter type control logic according to the comparison result.

* * * * *